United States Patent
Schoeneck et al.

(10) Patent No.: US 8,649,152 B2
(45) Date of Patent: Feb. 11, 2014

(54) CIRCUIT CONFIGURATION FOR REGULATING CURRENT IN A VALVE COIL

(75) Inventors: Markus Schoeneck, Talheim (DE); Michael Haug, Vaihingen/Enz (DE); Wolfgang Gscheidle, Oberstenfeld (DE); Markus Deeg, Eberdingen (DE); Dieter Woerner, Eppingen (DE)

(73) Assignee: Knorr-Bremse Systeme Fuer Nutzfahrzeuge GmbH, Munich (DE)

( * ) Notice: Subject to any disclaimer, the term of this patent is extended or adjusted under 35 U.S.C. 154(b) by 376 days.

(21) Appl. No.: 12/451,442

(22) PCT Filed: May 9, 2008

(86) PCT No.: PCT/EP2008/003726
§ 371 (c)(1), (2), (4) Date: Feb. 23, 2010

(87) PCT Pub. No.: WO2008/141735
PCT Pub. Date: Nov. 27, 2008

(65) Prior Publication Data
US 2010/0154903 A1 Jun. 24, 2010

(30) Foreign Application Priority Data
May 18, 2007 (DE) .......................... 10-2007-023-189

(51) Int. Cl.
*H01H 47/02* (2006.01)
(52) U.S. Cl.
USPC .......................................................... 361/191
(58) Field of Classification Search
USPC .......................................................... 361/191
See application file for complete search history.

(56) References Cited

U.S. PATENT DOCUMENTS

| 4,636,620 A * | 1/1987 | Wright et al. ................. 219/501 |
| 5,107,391 A | 4/1992 | Siepmann |
| 5,442,515 A | 8/1995 | Wallaert |
| 2005/0071098 A1 * | 3/2005 | Iannone et al. ................. 702/65 |

FOREIGN PATENT DOCUMENTS

| DE | 41 400 586 | 1/1994 |
| EP | 0 392 058 | 10/1990 |
| JP | 58 002625 | 1/1983 |
| KR | 2004 0068769 | 8/2004 |

OTHER PUBLICATIONS

Shruefer, E., "Elektrische Messtechnik", 9.aktualisierte Auflage, Muenchen, 2007, pp. 208 to 212 (ISBN 978-3-446-90904-0)*.
European Patent Office, Translation of International Preliminary Report on Patentability, Dec. 3, 2009, from International Patent Application No. PCT/EP2008/003726, filed on May 9, 2008.

* cited by examiner

*Primary Examiner* — Jared Fureman
*Assistant Examiner* — Nicholas Ieva
(74) *Attorney, Agent, or Firm* — Kenyon & Kenyon LLP

(57) ABSTRACT

A circuit configuration for recording the resistance of a coil of a magnetic valve, having at least one magnetic valve, having at least one valve coil that is to be actuated, a current source for applying a current to the at least one valve coil and generating a voltage drop at the at least one valve coil, and an evaluation circuit for outputting the voltage drop generated at the at least one valve coil as the output signal of the circuit configuration.

4 Claims, 1 Drawing Sheet

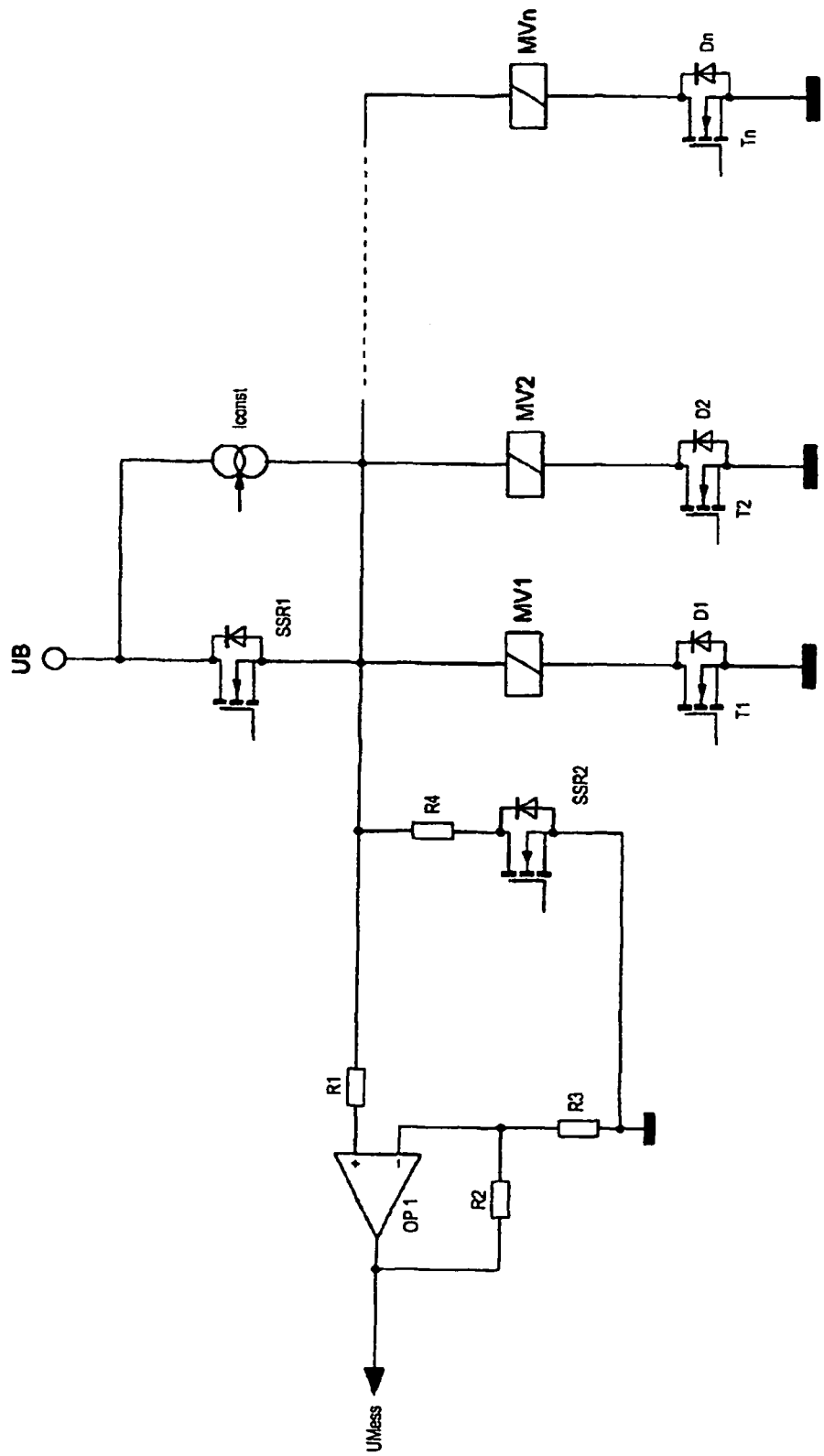

CIRCUIT CONFIGURATION FOR REGULATING CURRENT IN A VALVE COIL

FIELD OF THE INVENTION

The present invention relates to a circuit configuration for regulating current in a valve coil, and particularly relates to a circuit configuration for regulating current of a valve coil of a magnetic valve by temperature compensation and recording the absolute value of the internal resistance.

BACKGROUND INFORMATION

For the actuation of magnetic valves, a current, ideally a constant current is required, that is flowing through its valve coil, which is known as accurately as possible.

If a current regulation for actuating a magnetic valve is to be used, it may be put into effect using a relatively costly circuit configuration, which therefore does not represent a cost-effective design approach.

Other known methods and devices, used for the above purpose, are based on resistance measurement via resistance dividers or resistance bridge circuits, or measurement methods using alternating voltages and/or alternating currents.

Instead of a current regulation, current control may also be used by which the current flowing through the valve is controlled as a function of various environmental parameters, and which may have a good regulating quality of the current similar to that which is known of current regulation. For this purpose, multidimensional characteristics maps may be used in connection with a microcontroller control.

The supply voltage $U_B$ and the temperature of the valve coil, for instance, are also taken into account in the current as the parameter for the current control. The recording of the supply voltage may take place via a resistance divider, for example, in this instance. However, in this case the measurement of the temperature of the coil is costly, since the latter influences the internal resistance $R_{cu}$ of the coil, according to the equation $R_{cu}=R_{20}\times(1+\alpha\times\Delta T)$. Since the coils in question usually have a low internal resistance of a few Ohm, measuring the temperature of the coils via resistance dividers or resistance bridges cannot be carried out, as a rule.

In addition, a device for monitoring and compensating changes in a coil resistor of injector nozzles, of an internal combustion engine during use, is discussed in document US 2005/071098, in which a very small preset current is conducted through the coil of a magnetic valve during its use and when the magnetic valve is in a switched-off state established by pulse width modulation. While the current flows through the coil, the voltage at the coil is measured and the resistance of the coil is calculated from Ohm's law. If the actual resistance is known, the pulse control factor of the pulse width modulation for the compensation of a resistance deviation is changed.

Furthermore, document KR 2004 0068769 A discusses a temperature measuring device of a magnetic valve coil in which a temperature change of the magnetic valve coil is recorded, and a current corresponding to the recorded temperature change is supplied.

Finally, document U.S. Pat. No. 4,636,620 A discusses a control system having temperature compensation for an injector nozzle of an internal combustion engine, which uses the value of voltage levels at the nozzle coil to determine the temperature of the coil.

SUMMARY OF THE INVENTION

Therefore, the exemplary embodiments and/or exemplary methods of the present invention is based on the object of providing a circuit configuration for regulating the current in a valve coil of a magnetic valve, which permits a cost-effective measuring method without restrictions by electrical data of the valve coil, and gives a good regulating quality and regulating accuracy at the same time.

According to the exemplary embodiments and/or exemplary methods of the present invention, this object is achieved by the features set forth herein.

Advantageous further developments of the exemplary embodiments and/or exemplary methods of the present invention are the subject matter of the further description herein.

Consequently, a principle on which the exemplary embodiments and/or exemplary methods of the present invention is based is a scalable circuit configuration for recording the resistance of a coil of a magnetic valve, including a plurality of magnetic valves having a plurality of valve coils that are to be actuated, a semiconductor relay for each valve coil that is to be actuated for the individual switching of same, a current source, in common for all the valve coils, for applying a measuring current to respectively switched valve coil(s) and for generating a voltage drop at it or them, and an evaluation circuit for outputting the voltage drop generated at the respectively switched valve coil(s) as the output signal of the circuit configuration.

The current source, in this instance, is a switchable constant current source which applies a constant current to the valve coil. Because of this, an exactly known and constant current flowing through the valve coil is made available for actuating magnetic valves.

Moreover, multiple magnetic valves are wired up in parallel and are connected to the current source at a common node of the circuit configuration, whereby the circuit configuration is scalable, and is adjustable to the properties of the valve coils that are to be actuated.

If the evaluation circuit, or an output section, includes an operational amplifier, the voltage present at the common node of the circuit configuration may be amplified by a predetermined factor and may be suitably output as the output signal of the circuit configuration and processed further.

Switching processes in the circuit configuration may take place by semiconductor relays for the switching of the current source and of the at least one magnetic valve, using an n-channel field effect transistor (FET).

In a particularly advantageous manner, the instantaneous value of the absolute value of the resistance of the at least one valve coil, that is to be actuated, is recorded by the circuit configuration, which is composed of the resistance dependent on the temperature of the at least one valve coil and a manufacturing variance of the resistance of the at least one valve coil, so that one may omit a temperature recording that is difficult to implement during mass production and requires an offset adjustment.

In the following, the exemplary embodiments and/or exemplary methods of the present invention is described in greater detail based on exemplary embodiments, with reference to the drawing.

BRIEF DESCRIPTION OF THE DRAWING

FIG. 1 shows a simplified, cutout-like illustration of a circuit configuration for the current regulation of a valve coil according to an exemplary embodiment.

DETAILED DESCRIPTION

Going into detail, magnetic valves MV1 to MVn are shown in FIG. 1 which are connected together at a common summing point, for example, and to whose valve coils a current is to be applied, using the current regulation provided, that is as accurately known as possible and is ideally constant. Individual magnetic valves MV1 to MVn or rather their valve coils, are connected at one of their terminals, for example, via respective semiconductor relays, to a ground potential of the circuit configuration.

Furthermore, individual magnetic valve MV1 to MVn, or their valve coils, are connected at another one of their terminals to a common node of the circuit configuration, into which, in addition, a terminal (drain) of an additional semiconductor relay or main switch SSR1, a terminal of a constant current source $I_{const}$, which is, for instance, a switchable constant current source that supplies a constant current $I_{const}$ that is below an inrush current and an hold current, and a terminal of a resistor R4 lead. The common node is conducted via a resistor R1 to an input (+) of an operational amplifier OP1.

An additional terminal of semiconductor switch SSR1, same as another terminal of constant current source $I_{const}$, contacts a supply voltage $U_B$ of the circuit configuration.

For the voltage amplification of the voltage drop at the valve coil(s) of magnetic valves MV1 to MVn by operational amplifier OP1, an additional terminal of resistor R4 is connected to a terminal (source) of a still further semiconductor switch SSR2, whose drain terminal is at ground potential in common with a terminal of a resistor R3. The other terminal of resistor R3 is conducted to an additional input (−) of operational amplifier OP1, and at the same time, connected to a resistor R2, whose other terminal is conducted, in turn, to the output of operational amplifier OP1, at which output voltage UMess of the circuit configuration is also output, that is amplified if necessary and is to be conducted to a microcontroller (not shown) for additional processing.

The operational amplifier used may be selected appropriately for a desired voltage amplification, whereby accordingly values also come about for resistors R1 to R4 for their exterior wiring configuration.

Consequently, in the proposed circuit configuration for the resistance measurement of a valve coil, in agreement with the essential principle on which it is based, a connectable current source $I_{const}$, which may be a constant current source, is used, whose current $I_{const}$ flows through the valve coil(s) and generates a voltage drop there which, according to the equation $U_{cu}=R_{cu} \times I_{const}$ is proportional to the measuring current and the resistance of the valve coil(s).

This voltage is still amplified by a desired factor V to a voltage UMess, using operational amplifier OP1, and thereafter is supplied to a microcontroller which then, from voltage value UMess that was supplied to it, calculates a corresponding control current for the valve(s), and sets it.

Thus, the circuit described altogether records an instantaneous value of the absolute resistance of the valve coil, which is composed of the temperature-dependent resistance and the manufacturing tolerance of the coil resistance. The measurement of the current absolute resistance of the valve coil is sufficient for implementing an appropriately corrected actuation of the valve coil, which leads to a constant tractive power of same.

In summary, the provided circuit configuration leads to the following advantages:
 measurement is made using direct current, and not using alternating current;
 the circuit configuration may be produced cost-effectively using standard component parts;
 it is possible to measure individual coil temperatures of a plurality of valves within valve blocks;
 no additional temperature sensor is required;
 based on the measuring method directly in the coil, there is no corruption of the measuring result;
 it is possible to detect an interturn short circuit in the valve coil; and
 the circuit configuration is scalable and is adjustable to properties of the coil of the magnetic valve (inrush current/hold current).

Structural implementations which are similar to the description detailed herein are not to be judged as a departure from the subject matter of the exemplary embodiments and/or exemplary methods of the present invention, as specified and described herein.

The List of the Reference Numerals is as Follows:
OP1 operational amplifier;
R1 to R4 resistors;
SSR1 main switch;
T1/D1 to Tn/Dn magnetic valve output stages;
MV1 to MVn magnetic valves;
Iconst constant current source;
UB supply voltage; and
UMess output voltage.

What is claimed is:

1. A scalable circuit configuration for recording an instantaneous absolute resistance of a coil of a magnetic valve for a temperature correction of its actuation, comprising:
 a plurality of magnetic valves having a plurality of valve coils to be actuated, which are wired up in parallel at a common node of the circuit configuration;
 a plurality of semiconductor relays, in each case one semiconductor relay being provided for each of the plurality of valve coils to be actuated of the plurality of magnetic valves for individually switching each of the valve coils;
 an in-common connectable constant current source for the plurality of valve coils that are to be actuated for applying a constant current below an inrush current and a hold current to at least one respectively switched valve coil and for generating a voltage drop at the at least one respectively switched valve coil, the connectable constant current source being connected to the plurality of magnetic valves at the common node of the circuit configuration; and
 an evaluation circuit connected to the common node of the circuit configuration, for outputting the voltage drop that is generated at the at least one respectively switched valve coil, and is recordable at the common node of the circuit configuration, as an output signal of the circuit configuration, the evaluation circuit including an operational amplifier to amplify the voltage connected at the common node of the circuit configuration by a predetermined factor;
 wherein the instantaneous value of the absolute resistance of the at least one respectively switched valve coil that is to be actuated is recorded, which is composed of the temperature-dependent resistance of the at least one valve coil and a manufacturing tolerance of the resistance of the at least one valve coil, so that a temperature recording and offset adjustment are omitted during production, and
 wherein the operational amplifier outputs the amplified voltage output as the output signal of the circuit configuration.

2. The circuit configuration of claim 1, wherein a semiconductor relay is provided for switching the current source.

3. The circuit configuration of claim 1, wherein the plurality of semiconductor relays include a self-locking n-channel MOS field effect transistor.

4. The circuit configuration of claim 2, wherein the plurality of semiconductor relays include a self-locking n-channel MOS field effect transistor.

* * * * *

UNITED STATES PATENT AND TRADEMARK OFFICE
CERTIFICATE OF CORRECTION

PATENT NO. : 8,649,152 B2  Page 1 of 1
APPLICATION NO. : 12/451442
DATED : February 11, 2014
INVENTOR(S) : Schoeneck et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 602 days.

Signed and Sealed this

Twenty-ninth Day of September, 2015

Michelle K. Lee
*Director of the United States Patent and Trademark Office*